(12) United States Patent
Chang et al.

(10) Patent No.: US 9,274,393 B2
(45) Date of Patent: Mar. 1, 2016

(54) THIN FILM TRANSISTOR ARRAY PANEL, LIQUID CRYSTAL DISPLAY, AND METHOD TO REPAIR THE SAME

(71) Applicant: Samsung Display Co., Ltd., Yongin (KR)

(72) Inventors: Jong-Woong Chang, Asan-si (KR); Ho-Kyoon Kwon, Seoul (KR); Shin-Tack Kang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 265 days.

(21) Appl. No.: 13/968,978

(22) Filed: Aug. 16, 2013

(65) Prior Publication Data

US 2013/0335667 A1    Dec. 19, 2013

Related U.S. Application Data

(63) Continuation of application No. 13/016,438, filed on Jan. 28, 2011, now Pat. No. 8,514,338.

(30) Foreign Application Priority Data

Sep. 30, 2010 (KR) .................... 10-2010-0095177

(51) Int. Cl.
*G02F 1/136* (2006.01)
*G02F 1/1362* (2006.01)
*H01L 29/786* (2006.01)
*H01L 29/417* (2006.01)
*H01L 27/12* (2006.01)

(52) U.S. Cl.
CPC .... *G02F 1/136286* (2013.01); *G02F 1/136259* (2013.01); *H01L 27/1255* (2013.01);
(Continued)

(58) Field of Classification Search
CPC ................... G02F 1/136213; G02F 1/136286; H01L 27/1255; H01L 29/41733; H01L 29/786

USPC ............................................ 349/39
See application file for complete search history.

(56) References Cited

U.S. PATENT DOCUMENTS

| 5,943,106 A | 8/1999 | Sukenori et al. |
| 6,172,728 B1 * | 1/2001 | Hiraishi ................. 349/139 |
| 2004/0263724 A1 | 12/2004 | Kim et al. |

FOREIGN PATENT DOCUMENTS

| JP | 2004-334061 | 11/2004 |
| JP | 2006-208881 | 8/2006 |

(Continued)

OTHER PUBLICATIONS

Non-Final Office Action issued on Feb. 12, 2013 in U.S. Appl. No. 13/016,438.

(Continued)

*Primary Examiner* — James Dudek
(74) *Attorney, Agent, or Firm* — H.C. Park & Associates, PLC

(57) ABSTRACT

The present invention relates to a thin film transistor array panel, a liquid crystal display, and a method capable of reducing an effect on neighboring pixels in a process of repairing a pixel defect. The thin film transistor array panel may include: a thin film transistor connected to a gate line and a data line to define a pixel area; a pixel electrode formed in the pixel area and connected to the thin film transistor; and a storage electrode including a first portion overlapping the data line between two adjacent gate lines. The storage electrode may also include a second portion connected to the first portion and enclosing an edge of the pixel area except for a region where the first portion is formed. The storage electrode may be branched between pixel electrodes respectively formed in two adjacent pixel areas.

16 Claims, 16 Drawing Sheets

(52) U.S. Cl.
CPC ........ H01L29/41733 (2013.01); H01L 29/786 (2013.01); *G02F 1/136213* (2013.01); *G02F 2001/136263* (2013.01)

(56) References Cited

FOREIGN PATENT DOCUMENTS

| | | |
|---|---|---|
| JP | 2006-337453 | 12/2006 |
| JP | 2008-249895 | 10/2008 |
| KR | 10-0182014 | 12/1998 |
| KR | 10-2006-0012387 | 2/2006 |
| KR | 10-0656902 | 12/2006 |
| KR | 10-2008-0040440 | 5/2008 |
| KR | 10-2009-0053393 | 5/2009 |

OTHER PUBLICATIONS

Notice of Allowance issued on May 10, 2013 in U.S. Appl. No. 13/016,438.

* cited by examiner

THIN FILM TRANSISTOR ARRAY PANEL, LIQUID CRYSTAL DISPLAY, AND METHOD TO REPAIR THE SAME

CROSS REFERENCE TO RELATED APPLICATION

This application is a continuation of U.S. patent application Ser. No. 13/016,438, filed on Jan. 28, 2011, and claims priority from and the benefit of Korean Patent Application No. 10-2010-0095177, filed on Sep. 30, 2010, both of which are hereby incorporated by reference for all purposes as if fully set forth herein.

BACKGROUND OF THE INVENTION

1. Field of the Invention

Exemplary embodiments of the present invention relate to a thin film transistor array panel, a liquid crystal display, and a repairing method capable of reducing an influence generated between adjacent pixels in a process of repairing deteriorations.

2. Discussion of the Background

A liquid crystal display (LCD) is a widely-used flat panel display that includes two electrode-containing substrates and a liquid crystal layer interposed therebetween. By applying a signal to the electrodes, the amount of light transmitted by rearranging liquid crystal molecules of the liquid crystal layer can be controlled.

At least one of the substrates may include a thin film transistor (TFT) array panel used as a circuit board to independently drive each pixel in the liquid crystal display or an organic light emitting device.

The TFT array panel may include a gate line transmitting a gate signal; a data line transmitting a data signal and intersecting the gate line; a thin film transistor connected to the gate line and the data line; and a pixel electrode connected to the thin film transistor.

When signal lines of the liquid crystal display are disconnected or shorted, a corresponding pixel may need to be repaired. After being repaired, however, the repaired pixel and a pixel neighboring the repaired pixel may have a higher or lower luminance than that of a normal pixel.

The above information disclosed in this Background section is only for enhancement of understanding of the background of the invention and therefore it may contain information that does not form the prior art that is already known in this country to a person of ordinary skill in the art.

SUMMARY OF THE INVENTION

Exemplary embodiments of the present invention provide a liquid crystal display, a thin film transistor array panel capable of reducing distortion of a potential charged to an adjacent pixel electrode by a data signal input to a storage electrode used for repairing when pixel deterioration due to a disconnection of a data line is generated, and a repairing method thereof.

Exemplary embodiments of the present invention also provide a liquid crystal display, a thin film transistor array panel capable of reducing the effect on the adjacent pixel electrode by the storage electrode used for repairing when a pixel deterioration due to a short of a pixel electrode and a storage electrode is generated, and a repairing method thereof are provided.

Exemplary embodiments of the present invention also provide a liquid crystal display, a thin film transistor array panel capable of stably executing a repairing process, and a repairing method thereof are provided.

Additional features of the invention will be set forth in the description which follows, and in part will be apparent from the description, or may be learned by practice of the invention.

Exemplary embodiments of the present invention disclose a thin film transistor array panel including a substrate, a gate line, a data line, a thin film transistor, a pixel electrode, and a storage electrode. The data line intersects the gate line. The gate line and the data line are formed on the substrate and define a pixel area. The thin film transistor is connected to the gate line and the data line. The pixel electrode is formed in the pixel area and connected to the thin film transistor. The storage electrode includes a first portion overlapping the data line between two adjacent gate lines, and a second portion connected to the first portion and enclosing an edge of the pixel area except for a region where the first portion is formed. The storage electrode is branched between the pixel electrodes respectively formed in two adjacent pixel areas.

Exemplary embodiments of the present invention disclose a liquid crystal display includes a first substrate, a second substrate facing the first substrate, a gate line and a data line intersecting the gate line, a thin film transistor, a pixel electrode, and a storage electrode. The gate line and the data line define a pixel area on the first substrate. The thin film transistor is connected to the gate line and the data line. The pixel electrode is connected to the thin film transistor in the pixel area. The storage electrode includes a first portion overlapping the data line between two adjacent gate lines, and a second portion connected to the first portion and enclosing an edge of the pixel area except for a region where the first portion is formed. The storage electrode is branched between the pixel electrodes respectively formed in two adjacent pixel areas.

Exemplary embodiments of the present invention disclose a method to repair a data line in a thin film transistor array panel, the method includes if the data line is disconnected at a disconnection portion, irradiating a laser on at least one side of the disconnected portion of the data line to short the data line and a storage electrode; and irradiating the laser to separate a portion shorted to the data line among the storage electrode to be disconnected. The storage electrode includes a first portion overlapping the data line between two adjacent gate lines and a second portion connected to the first portion and enclosing an edge of a pixel area except for a region where the first portion is formed. The pixel area is defined by the data line and a gate line. A thin film transistor is coupled to the data line, the gate line, and at least one of the pixel electrodes. The two adjacent pixel areas are defined by the two adjacent gate lines and two adjacent data lines, and the storage electrode is branched between pixel electrodes respectively formed in the two adjacent pixel areas.

Exemplary embodiments of the present invention disclose a method of repairing a short of a pixel electrode and a storage electrode. The method includes irradiating laser to separate a portion shorted to the pixel electrode among the storage electrode to be disconnected. The storage electrode includes a first portion overlapping the data line between two adjacent gate lines and a second portion connected to the first portion and enclosing an edge of a pixel area except for a region where the first portion is formed. The pixel area is defined by the data line and a gate line. A thin film transistor is coupled to the data line, the gate line, and the pixel electrode. The two adjacent pixel areas are defined by the two adjacent gate lines and two adjacent data lines, and the storage electrode is branched between pixel electrodes respectively formed in the two adjacent pixel areas Exemplary embodiments of the present invention disclose a method of repairing a disconnection of a data line. The method includes irradiating a laser on at least one side of a disconnected portion of the data line to short the data line and a storage electrode, and irradiating the laser to separate a portion shorted to the data line among the storage electrode to be disconnected. The storage electrode includes a first portion overlapping the data line between two adjacent gate lines and a second portion connected to the first portion and enclosing an edge of a pixel area except for a region where the first portion is formed. The pixel area is defined by the data line and a gate line. A thin film transistor is coupled to the data line, the gate line, and a pixel electrode. The two adjacent pixel areas are defined by the two adjacent gate lines and two adjacent data lines, and the storage electrode is branched between pixel electrodes respectively formed in the two adjacent pixel areas.

Exemplary embodiments of the present invention disclose a method of repairing a short of a pixel electrode and a storage electrode. The method includes irradiating a laser to separate a portion shorted to the pixel electrode among the storage electrode to be disconnected. The storage electrode includes a first portion overlapping a data line between two adjacent gate lines and a second portion connected to the first portion and enclosing an edge of a pixel area except for a region where the first portion is formed. The pixel area is defined by the data line and a gate line. A thin film transistor is coupled to the data line, the gate line, and the pixel electrode. The two adjacent pixel areas are defined by the two adjacent gate lines and two adjacent data lines, and the storage electrode is branched between pixel electrodes respectively formed in the two adjacent pixel areas.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
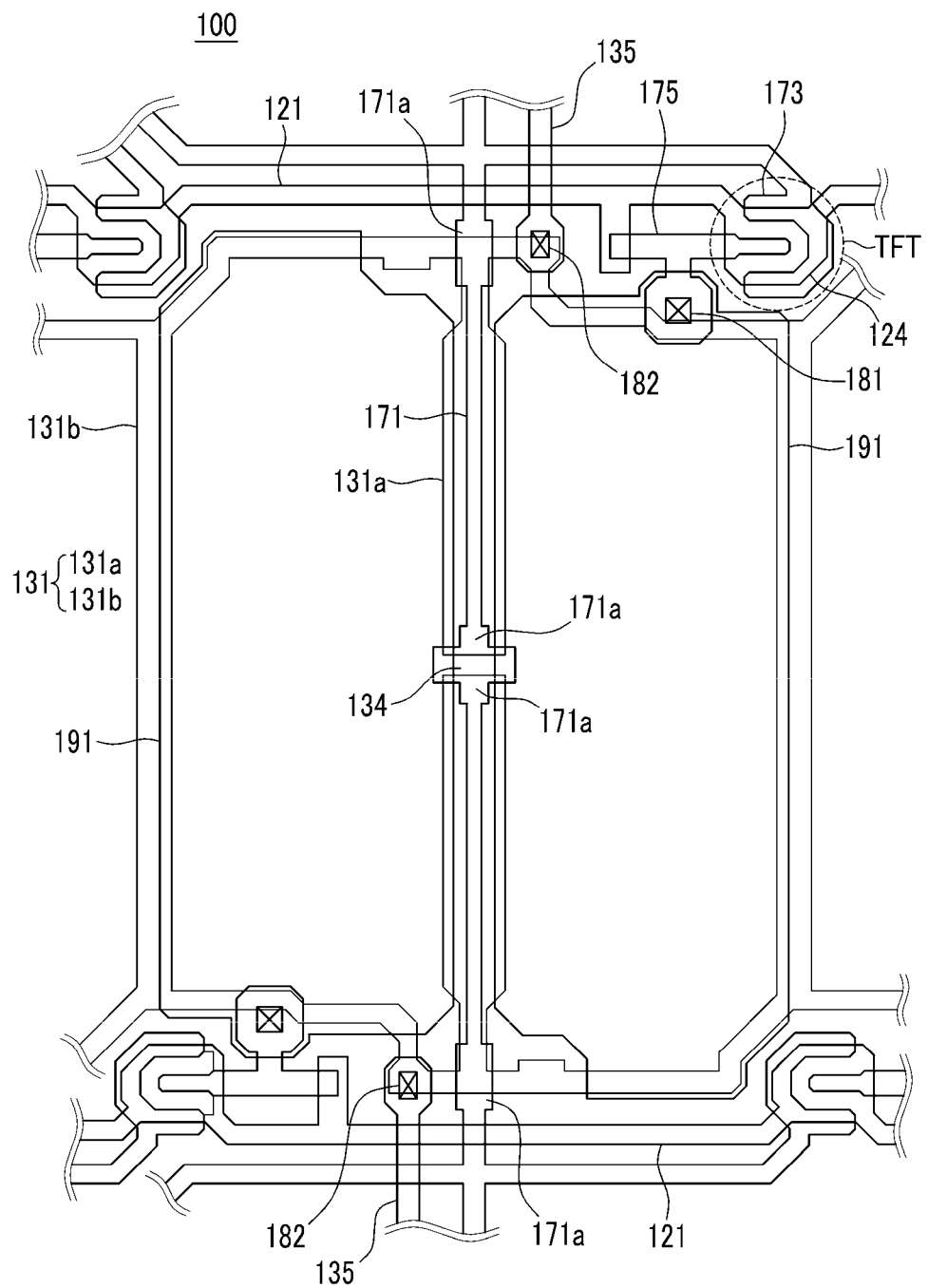
FIG. 1 is a top plan view of a thin film transistor array panel according to exemplary embodiments of the present invention.
Figure 2:
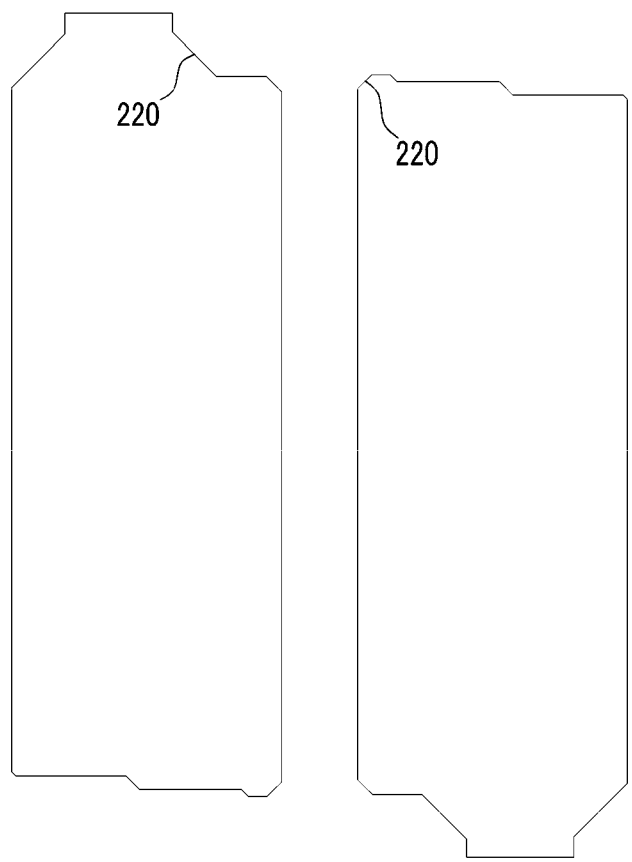
FIG. 2 is a top plan view of a color filter panel according to exemplary embodiments of the present invention.
Figure 3:
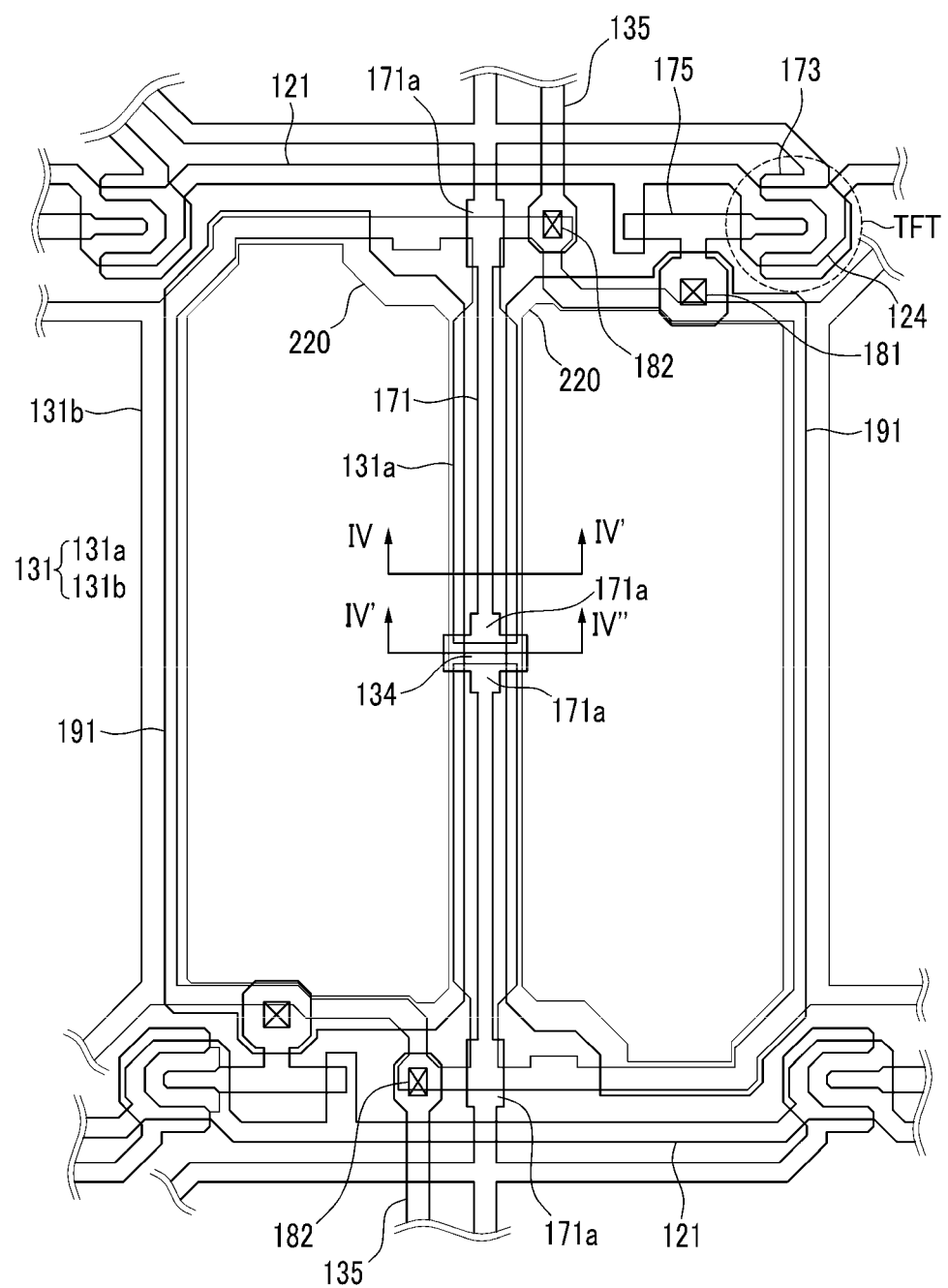
FIG. 3 is a top plan view of a liquid crystal display according to exemplary embodiments of the present invention.
Figure 4:
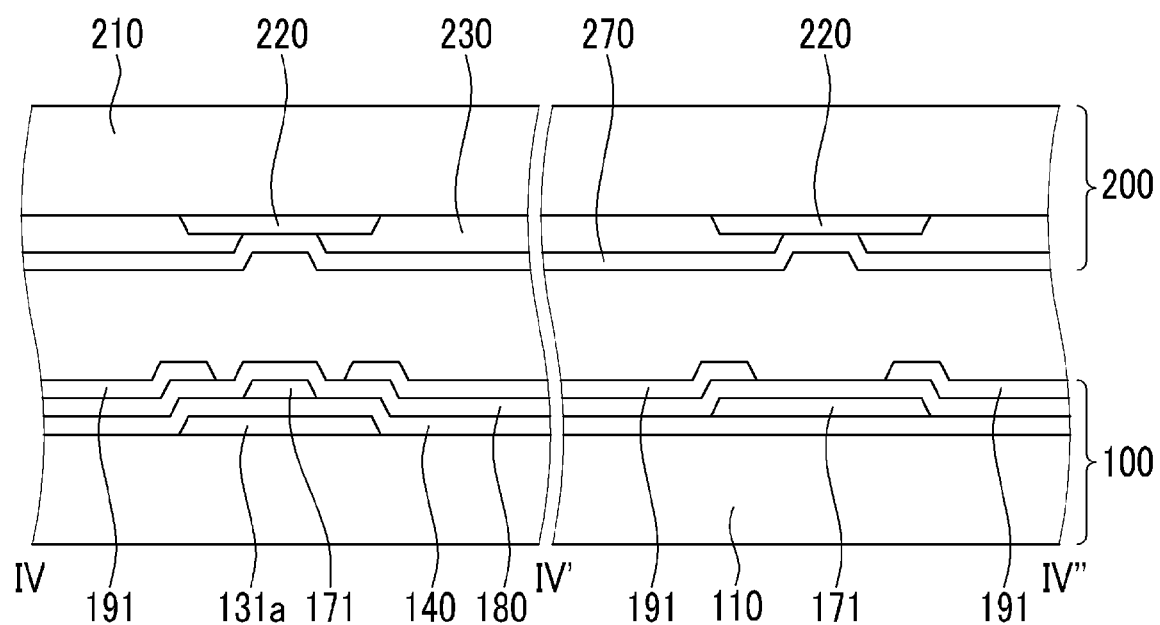
FIG. 4 is a cross-sectional view taken along the line IV-IV' of FIG. 3 according to exemplary embodiments of the present invention.
Figure 5:
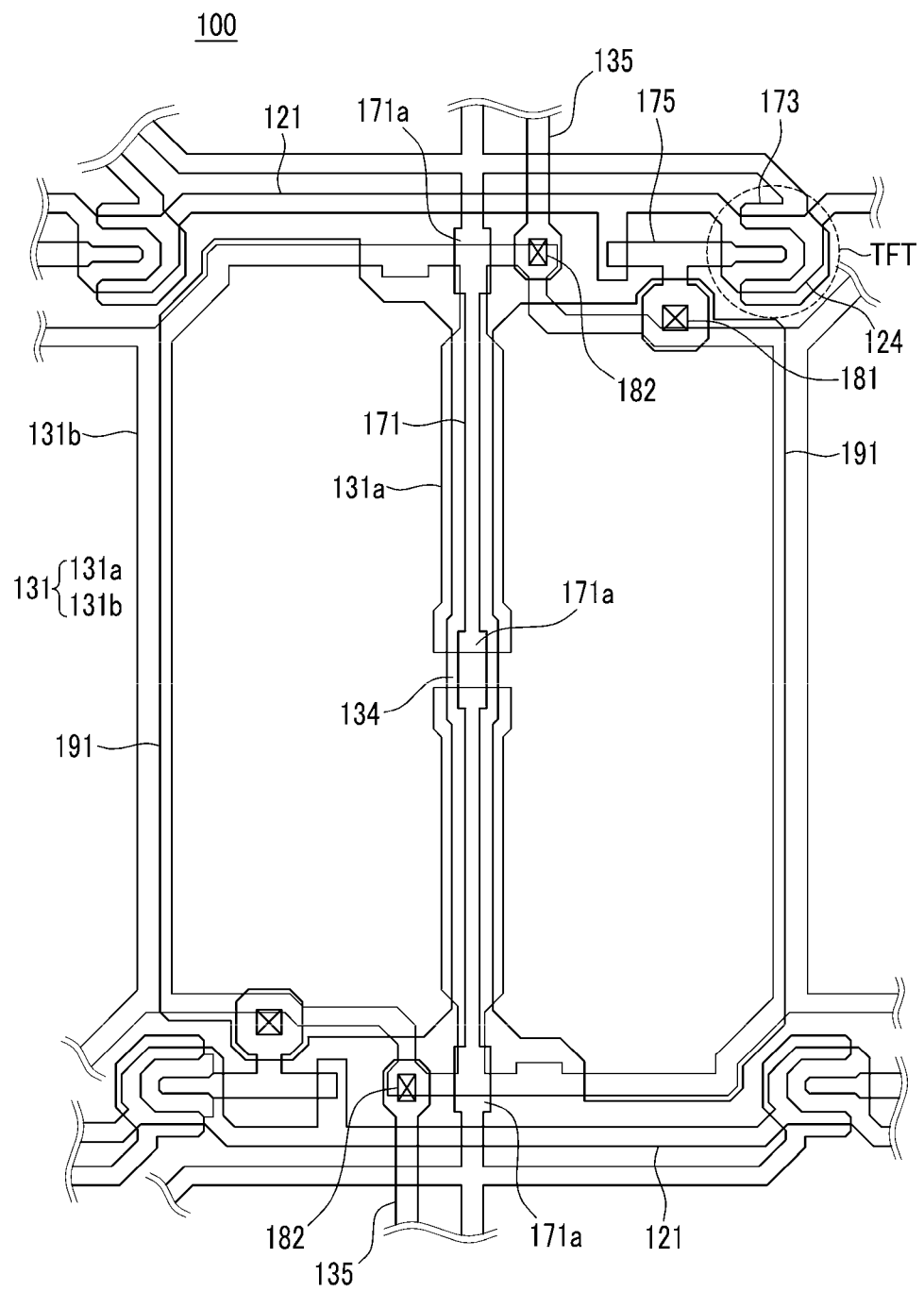
FIG. 5 is a top plan view of a thin film transistor array panel according to exemplary embodiments of the present invention.
Figure 6:
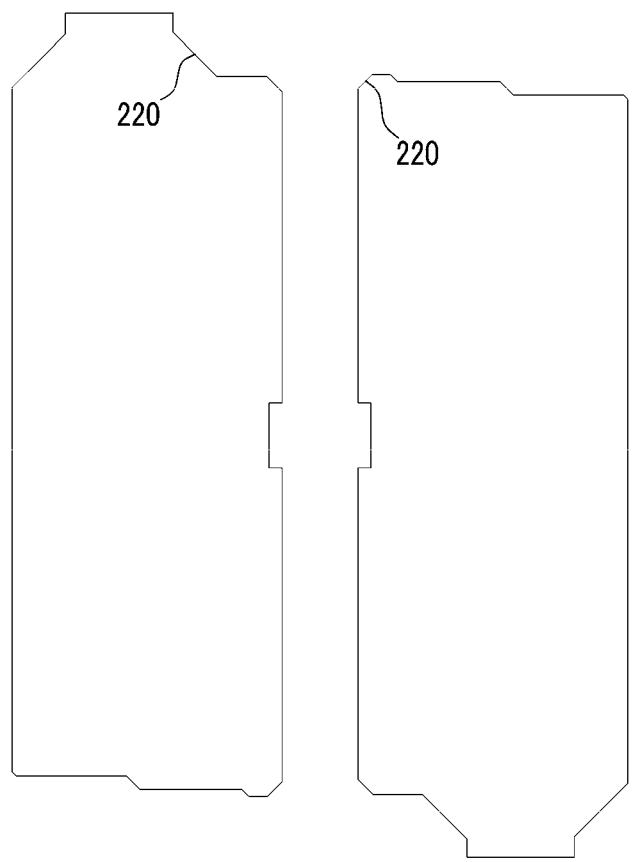
FIG. 6 is a top plan view of a color filter panel according to exemplary embodiments of the present invention.
Figure 7:
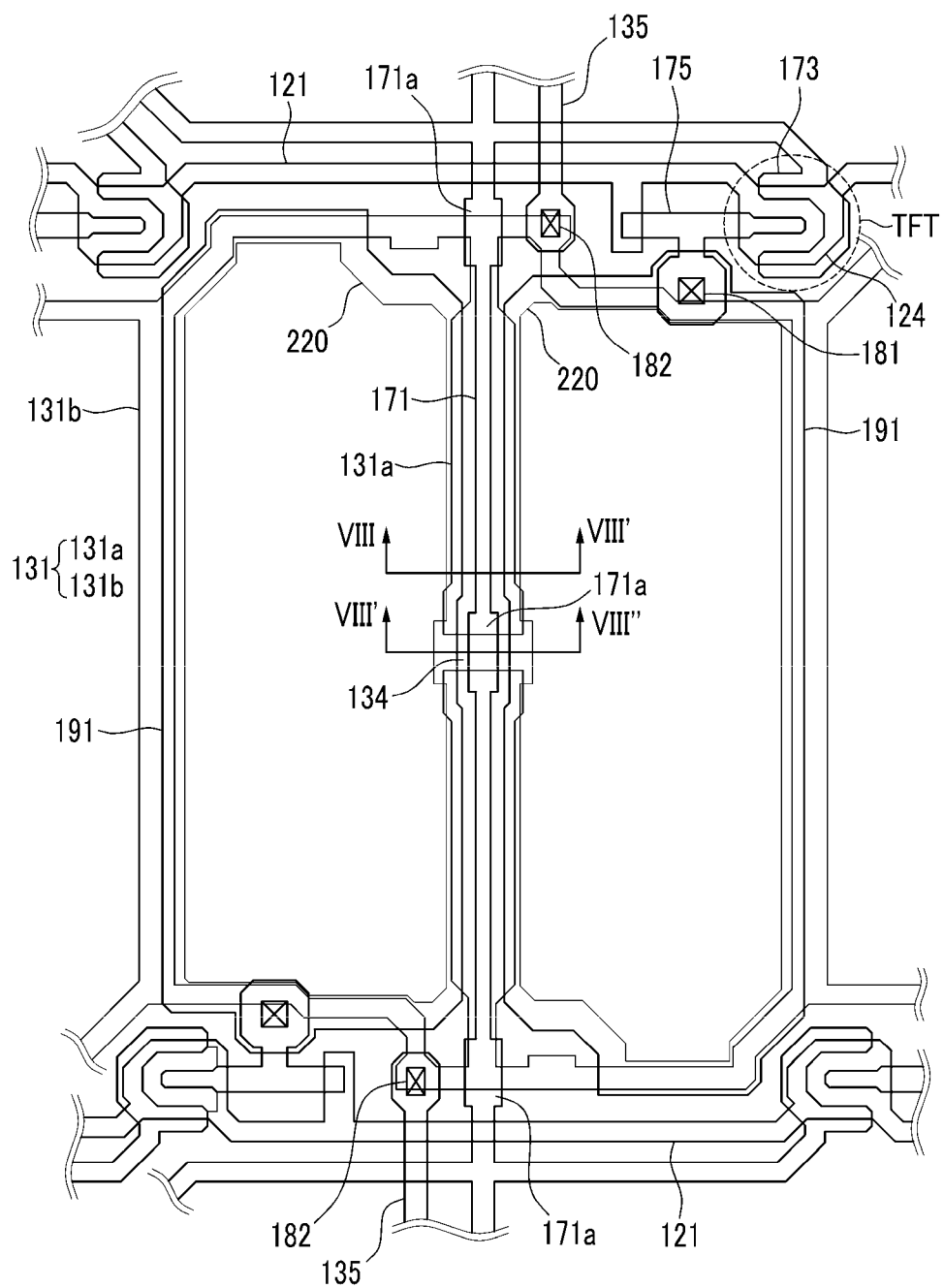
FIG. 7 is a top plan view of a liquid crystal display according to exemplary embodiments of the present invention.
Figure 8:
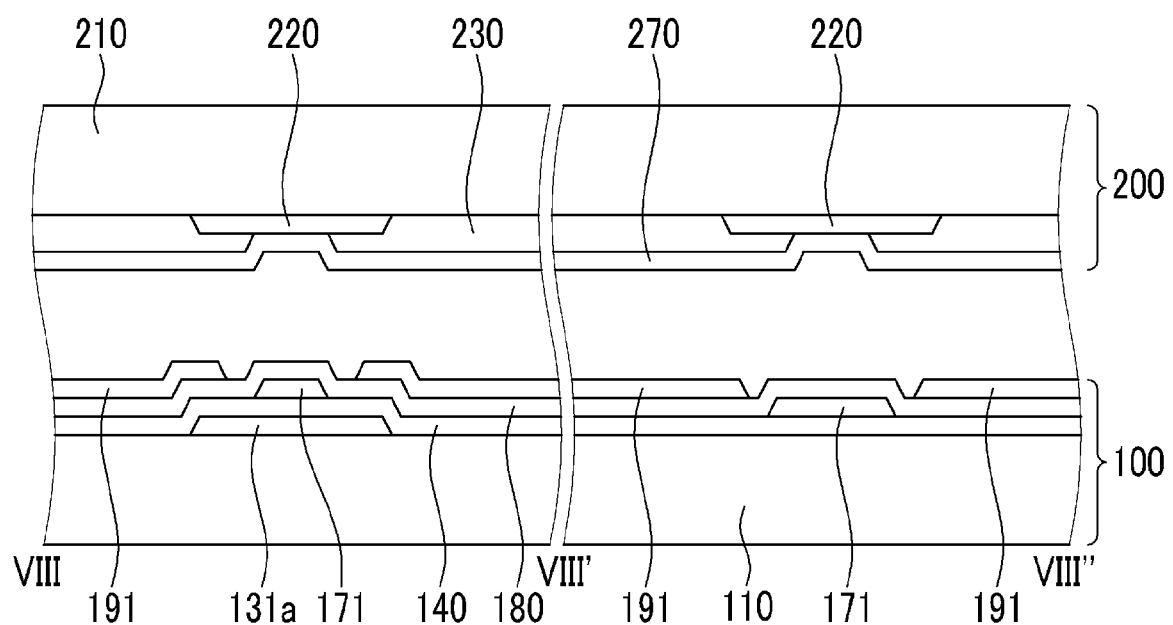
FIG. 8 is a cross-sectional view taken along line VIII-VIII' of FIG. 7 according to exemplary embodiments of the present invention.

Exemplary embodiments of the present invention are described hereinafter with reference to the accompanying drawings. As those skilled in the art would realize, the exemplary embodiments may be modified in various ways, without departing from the spirit or scope of the present invention.

In the drawings, the sizes and relative sizes of layers, films, panels, and regions may be exaggerated for clarity. Like reference numerals designate like elements throughout the specification. It will be understood that when an element such as a layer, film, region, or substrate is referred to as being "on", "connected to", or "coupled to" another element or layer, it can be directly on, connected or coupled to the other element or layer or intervening elements or layers may be present. In contrast, when an element is referred to as being "directly on," "directly connected to" or "directly coupled to" another element or layer, there may be no intervening elements or layers present.

It should be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the exemplary embodiments of the invention. As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing exemplary embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, exemplary embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a liquid crystal display according to exemplary embodiments of the present invention will be described with reference to the accompanying drawings.

Referring to FIG. 1, FIG. 2, FIG. 3, and FIG. 4, a liquid crystal display (LCD) may include a thin film transistor array panel 100, a common electrode panel 200, and liquid crystal layer (not shown) interposed between the thin film transistor array panel 100 and the common electrode panel 200.

The thin film transistor array panel 100 may include a first substrate 110, gate lines 121 and data lines 171 intersecting each other on the first substrate 110 to define pixel areas, a thin film transistor (TFT) connected to the gate line 121 and the data line 171, a pixel electrode 191 connected to the thin film transistor (TFT) of the pixel area, and a storage electrode 131 formed at the lower portion of the data line 171 and the edge of the pixel area.

The gate line 121 may be formed in one direction on the first substrate 110, and may include a gate electrode 124 protruded from the gate line 121.

The data line 171 may be formed in the direction intersecting the gate line 121, and may include a source electrode 173 and a drain electrode 175. The source electrode 173 may protrude from the data line 171 towards the gate electrode 124, and the drain electrode 175 may be formed, at least in part, on the gate electrode 124 and separated from the source electrode 173 by a predetermined interval.

A gate insulating layer 140 may be formed between the gate line 121 and the data line 171, and although not shown, a semiconductor layer may be formed on the gate insulating layer 140 on the gate electrode 124. The gate electrode 124, the semiconductor layer, the source electrode 173, and the drain electrode 175 can form the thin film transistor (TFT).

A passivation layer 180 may be formed between the data line 171 and the pixel electrode 191. The pixel electrode 191 may be connected to the drain electrode 175 of the thin film transistor (TFT) through a contact hole 181 of the passivation layer 180. The data lines 171, gate lines 121, semiconductor layer, pixel electrode 191, contact hole 181, passivation layer 180 are known elements in the art, and therefore a detailed description thereof is not provided herein.

The storage electrode 131 may include a first portion 131a and a second portion 131b. The first portion 131a may overlap the data line 171 between two gate lines 121. The second portion 131b may enclose the edge of the pixel area and may be connected to the first portion 131a. In some cases, the first portion 131a may be disconnected at a disconnection portion 134 thereby dividing the first portion 131a into two portions. The disconnection portion 134 may be positioned at the center between two adjacent gate lines 121. In general, the disconnection portion 134 may be located at any location between two adjacent gate lines 121. In some cases, the first portion 131a may be divided into more than two portions. In general, the first portion 131a may be divided into any suitable number of portions. In some cases, the first portion 131a may not be divided.

In some cases, the data line 171 overlapping the disconnection portion 134 may have a wider width than a width of the data line 171 that does not overlap the first portion 131a of the storage electrode 131. The storage electrode 131 may be made of any suitable material including, for example, an opaque metal to prevent light leakage. Light leakage may occur in or around the disconnection portion 134. In some cases, the data line 171 overlapping the disconnection portion 134 may initially be formed with the same width of the first portion 131a of the storage electrode 131. The width of the data line 171 on the disconnection portion 134 may then be widened thereby preventing light leakage.

In general, the liquid crystal display may have any suitable aperture ratio. In some cases, the aperture ratio of the liquid crystal display may be about 54.7% with the expansion of the width of the data line 171. The aperture ratio of the liquid crystal display without the disconnection portion 134 and the expansion of the width of the data line 171 may also be about 54.7%. Accordingly, the aperture ratio is not reduced due to the expansion of the width of the data line 171.

When repairing a data line 171 to repair a disconnection caused by irradiation of a laser, the width of a repairing portion 171a may be expanded. That is, the width of the repairing portion 171a may be wider than the width of the data line 171 overlapping the first portion 131a of the storage electrode 131. In some cases, the width of the repairing portion 171a may be narrower than the width of the data line 171 overlapping the disconnection portion 134. The repairing portion 171a may be the upper and lower portions of the data line 171 adjacent to the disconnection portion 134 and the portion of the data line 171 overlapping the portion connected to the first portion 131a and the second portion 131b.

The storage electrodes 131 of each pixel area may be connected to each other. The second portions 131b of the storage electrodes 131 positioned at two adjacent pixel areas via the gate line 121 may be connected by a bridge 135. The storage electrode 131 may be made in the same layer as at least one of the gate line 121, the gate electrode 124, and the gate insulating layer 140. The passivation layer 180 may have a contact hole 182 where the second portion 131b of the storage electrode 131 and the bridge 135 connect.

The common electrode panel 200 may include a second substrate 210, a light blocking member 220 formed on the second substrate 210 and corresponding to the edge of the pixel area of the first substrate 110, a color filter 230 formed on the second substrate 210 and corresponding to the pixel area of the first substrate 110, and a common electrode 270 formed on the second substrate 210. In some cases, the common electrode 270 may be formed on the entire second substrate 210.

The light blocking member 220 may be formed corresponding to the gate line 121, the data line 171, the thin film transistor (TFT), and the storage electrode 131 to prevent light leakage.

The color filter 230 may be used to realize color of the liquid crystal display. For example, red, blue, and/or green color filters 230 may be disposed in any suitable manner, including for example, repeatedly disposing the red, blue, and green color filters 230 on the second substrate 210.

The common electrode 270 may be oriented to face the pixel electrode 191 formed on the first substrate 110 to generate an electric field in the liquid crystal layer interposed between the TFT array panel 100 and the common electrode panel 200. The electric field may be generated according to voltages applied to the pixel electrode 191 and the common electrode 270 such that the arrangement of the liquid crystal molecules is determined and the polarization of incident light is controlled to display an image.

Hereinafter, a liquid crystal display according to the exemplary embodiments of the present invention will be described with reference to FIG. 5, FIG. 6, FIG. 7, and FIG. 8.

Referring to FIG. 5, FIG. 6, FIG. 7, and FIG. 8, a liquid crystal display may include a thin film transistor array panel 100 and a common electrode panel 200 facing the thin film transistor array panel 100. A liquid crystal layer (not shown) may be interposed between the thin film transistor array panel 100 and the common electrode panel 200.

The thin film transistor array panel 100 may include the first substrate 110, the gate line 121, the data line 171, the thin film transistor (TFT), the pixel electrode 191, and the storage electrode 131 as described above. The storage electrode 131 may include the first portion 131a and the second portion 131b. The first portion 131a may include the disconnection portion 134.

However, contrary to the exemplary embodiments illustrated in FIG. 1, FIG. 2, FIG. 3, and FIG. 4, the data line 171 overlapping the disconnection portion 134 in FIG. 5, FIG. 6, FIG. 7, and FIG. 8 may be formed to have the same width as the width of the repairing portion 171a. Also, the data line 171 overlapping the disconnection portion 134 may be formed to have the same width as the width of the data line 171 overlapping the first portion of the storage electrode 131. For example, in FIG. 1, FIG. 2, FIG. 3, and FIG. 4, the width of the data line 171 is expanded to prevent the light leakage on the disconnection portion 134; however, in FIG. 5, FIG. 6, FIG. 7, and FIG. 8, the light leakage can be prevented through other means such that it is not necessary to expand the width of the data line 171.

The common electrode panel 200 may include the second substrate 210, the light blocking member 220, the color filter 230, and the common electrode 270 as described above.

However, contrary to the exemplary embodiments illustrated in FIG. 1, FIG. 2, FIG. 3, and FIG. 4, the light blocking member 220 overlapping the disconnection portion 134 in FIG. 5, FIG. 6, FIG. 7, and FIG. 8 may have a wider width than the width of the light blocking member 220 overlapping the first portion 131a of the storage electrode 131. Also, the light blocking member 220 overlapping the disconnection portion 134 may have a wider width than the width of the first portion 131a of the storage electrode 131. That is, the width of the light blocking member 220 corresponding to the disconnection portion 134 may be expanded such that the light leakage in or around the disconnection portion 134 may be prevented.

In general, the liquid crystal display may have any suitable aperture ratio. In some cases, the aperture ratio of the liquid crystal display with the disconnection portion 134 described with reference to FIG. 5, FIG. 6, FIG. 7, and FIG. 8 may be about 54.3%. The aperture ratio of the liquid crystal display without the disconnection portion 134 and the expansion of the width of the data line 171 may be approximately 54.7%. Accordingly, the aperture ratio may be negligibly, but slightly changed due to expansion of the width of the light blocking member 220.

Hereinafter, a liquid crystal display according to exemplary embodiments of the present invention will be described with reference to FIG. 9, which is a top plan view of a thin film transistor array panel.

Figure 9:
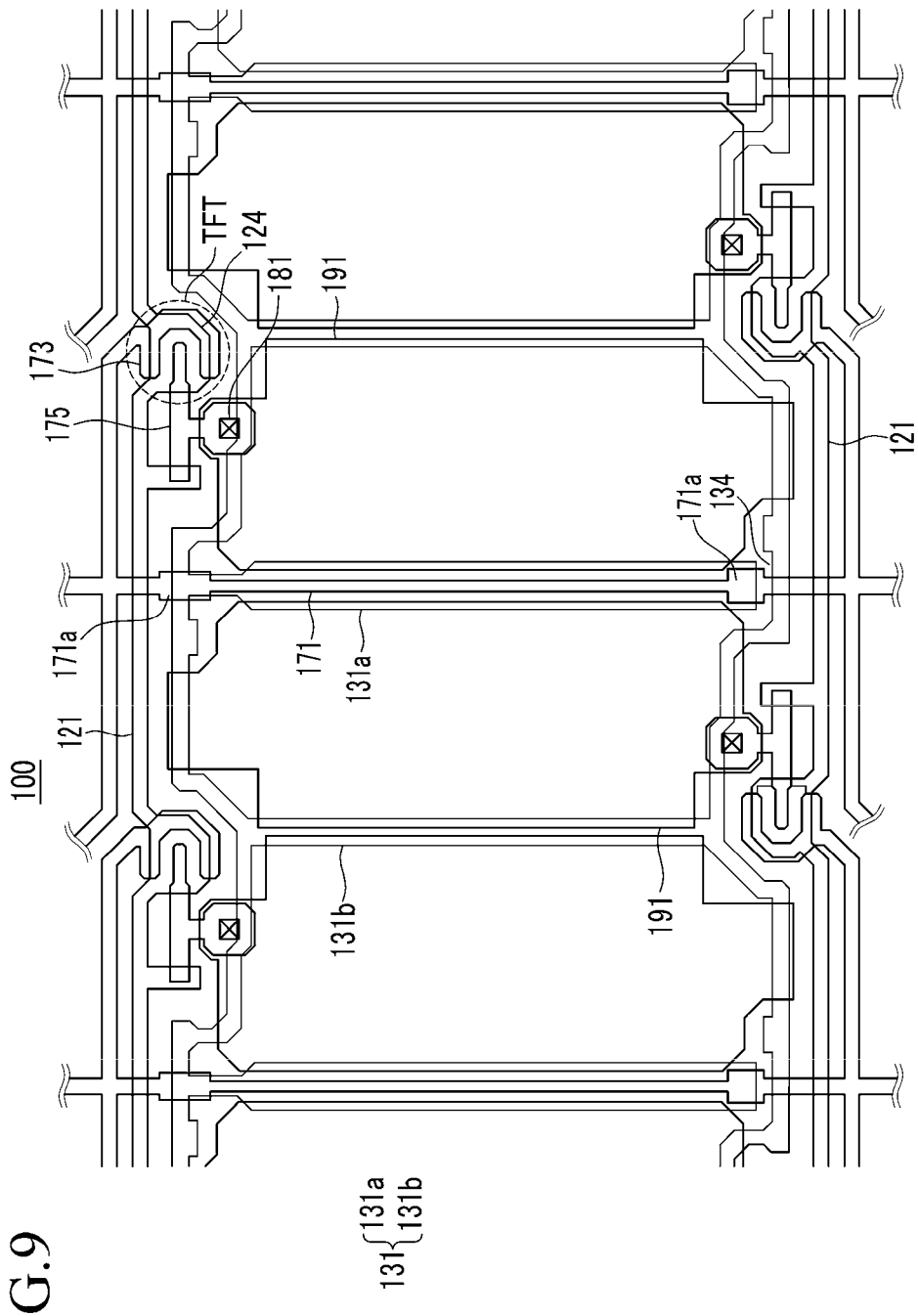
FIG. 9 is a top plan view of a liquid crystal display according to exemplary embodiments of the present invention.

Referring to FIG. 9, a liquid crystal display may include a thin film transistor array panel 100 and a common electrode panel (not shown) facing thin film transistor array panel 100. A liquid crystal layer (not shown) may be interposed between the thin film transistor array panel 100 and the common electrode panel 200.

The thin film transistor array panel 100 may include the first substrate 110, the gate line 121, the data line 171, the thin film transistor (TFT), the pixel electrode 191, and the storage electrode 131 as described above with reference to FIG. 1, FIG. 2, FIG. 3, and FIG. 4.

Referring to FIG. 9, two pixel areas may be defined by two adjacent gate lines 121 and two adjacent data lines 171, and the pixel electrode 191 may be formed in each pixel area. The pixel electrode 191 may not overlap the storage electrode 131 at all the vertexes of the pixel area. For example, the storage electrode 131 may be branched between the pixel electrodes 191 of two adjacent pixel areas. When a disconnection defect of the data line 171 or a shorting defect between the pixel electrode 191 and the storage electrode 131 is generated, the storage electrode 131 may be disconnected by irradiating, using a laser, storage electrode 131 that does not overlap the pixel electrode 191 under the repairing process.

The storage electrode 131 may include the first portion 131a and the second portion 131b; however, contrary to the exemplary embodiments illustrated in FIG. 1, FIG. 2, FIG. 3, and FIG. 4, the disconnection portion 134 may be formed on the lower end of the first portion 131a. For example, the lower end of the first portion 131a may not be connected to the second portion 131b, but the upper end of the first portion 131a may be connected to the second portion 131b. Accordingly, the upper end of the first portion 131a may be disconnected from the second portion 131b through laser irradiation while the lower end of the first portion 131a may already be disconnected from the second portion 131b under the repairing processing at the portion overlapping the data line 171.

The repairing portion 171a may be shorted in the data line 171 under the repairing processing. The width of the repairing portion 171a may be expanded such that connection through the laser irradiation is easy. That is, the width of the repairing portion 171a may be wider than the portion that does not overlap the first portion 131a of the storage electrode 131. The repairing portion 171a may be the upper portion of the first portion 131a neighboring the disconnection portion 134.

The first portion 131a of the storage electrode 131 and the pixel electrode 191 may overlap each other, and the overlapping width may be less than 3.5 um. In some cases, the overlapping width of the first portion 131a and the pixel electrode 191 may be reduced to 3.5 um from 4.5 um such that the effect of the data signal flowing to the first portion 131a used for repairing the disconnection defect of the data line 171 may be reduced on the pixel electrode 191. In general, the overlapping width may be any suitable width.

Hereinafter, a method of repairing a disconnection of a data line of a liquid crystal display according to exemplary embodiments of the present invention will be described.

Figure 10:
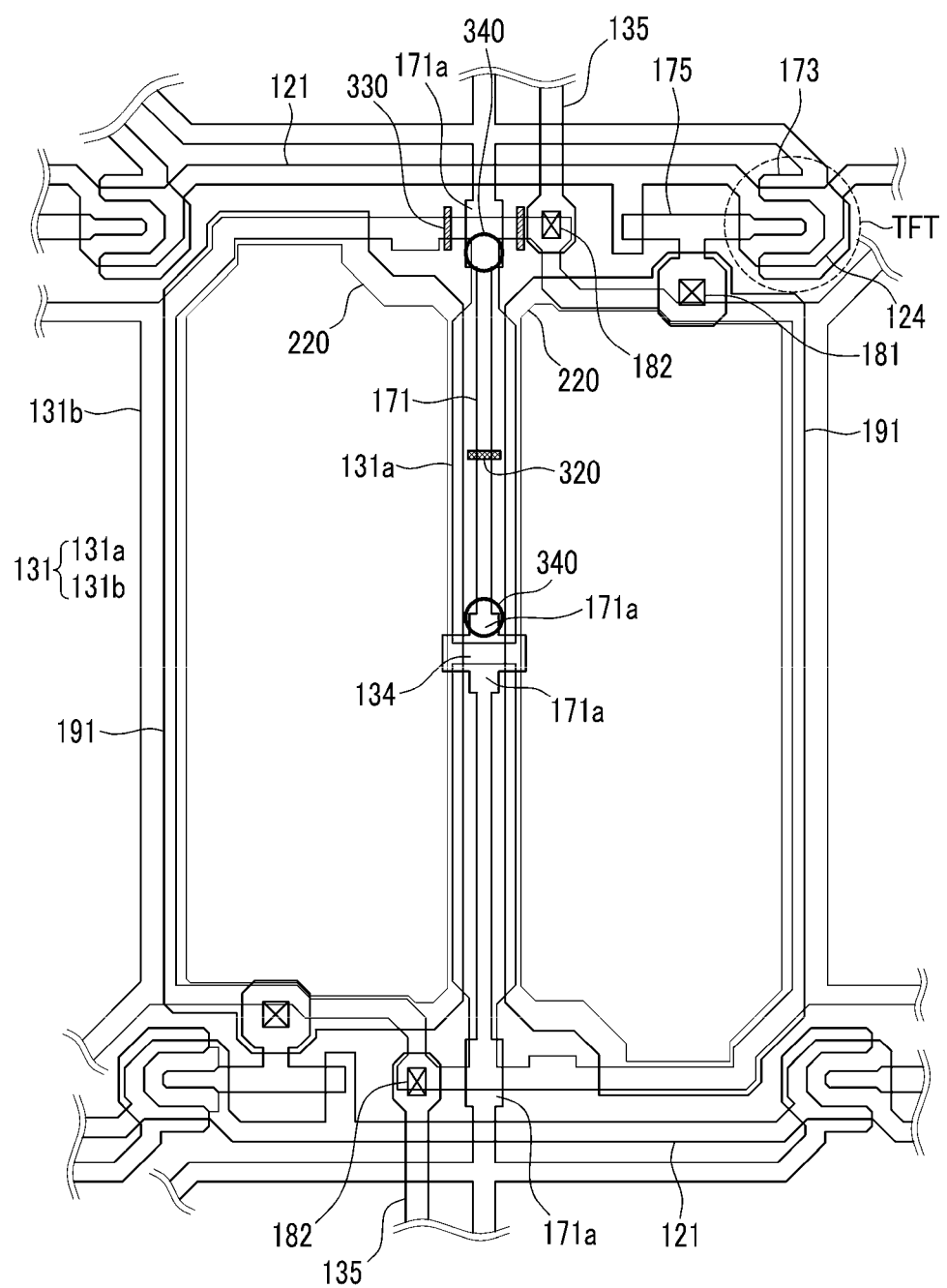
FIG. 10 is a top plan view showing a method of repairing a disconnection of a data line of a liquid crystal display according to exemplary embodiments of the present invention.

FIG. 10 is a top plan view showing a method of repairing a disconnection of a data line of the liquid crystal display described with reference to FIG. 1, FIG. 2, FIG. 3, and FIG. 4.

Referring to FIG. 10, when a defect of the data line 171 disposed at an upper side relative to the disconnection portion 134 being disconnected is generated, the signal transmitted through the data line 171 may not be transmitted to the lower side of a disconnection defect portion 320.

The repairing portions 171a disposed on the upper and/or lower sides of the disconnection defect portion 320 may be irradiated by a laser 340 for the data line 171 and the first portion 131a of the storage electrode 131 to be connected such that the signal applied to the data line 171 may be transmitted through the storage electrode 131.

Next, to electrically disconnect the second portion 131b connected to the first portion 131a of the storage electrode 131 used for the repair, laser from a laser 330 may be irradiated on the second portion 131b of the storage electrode 131 that does not overlap the data line 171. The laser 330 may irradiate laser on both sides of the storage electrode 131 used for the repair and overlapping of the data line 171.

Hereinafter, a method of repairing a disconnection of a data line of a liquid crystal display according to exemplary embodiments of the present invention will be described.

Figure 11:
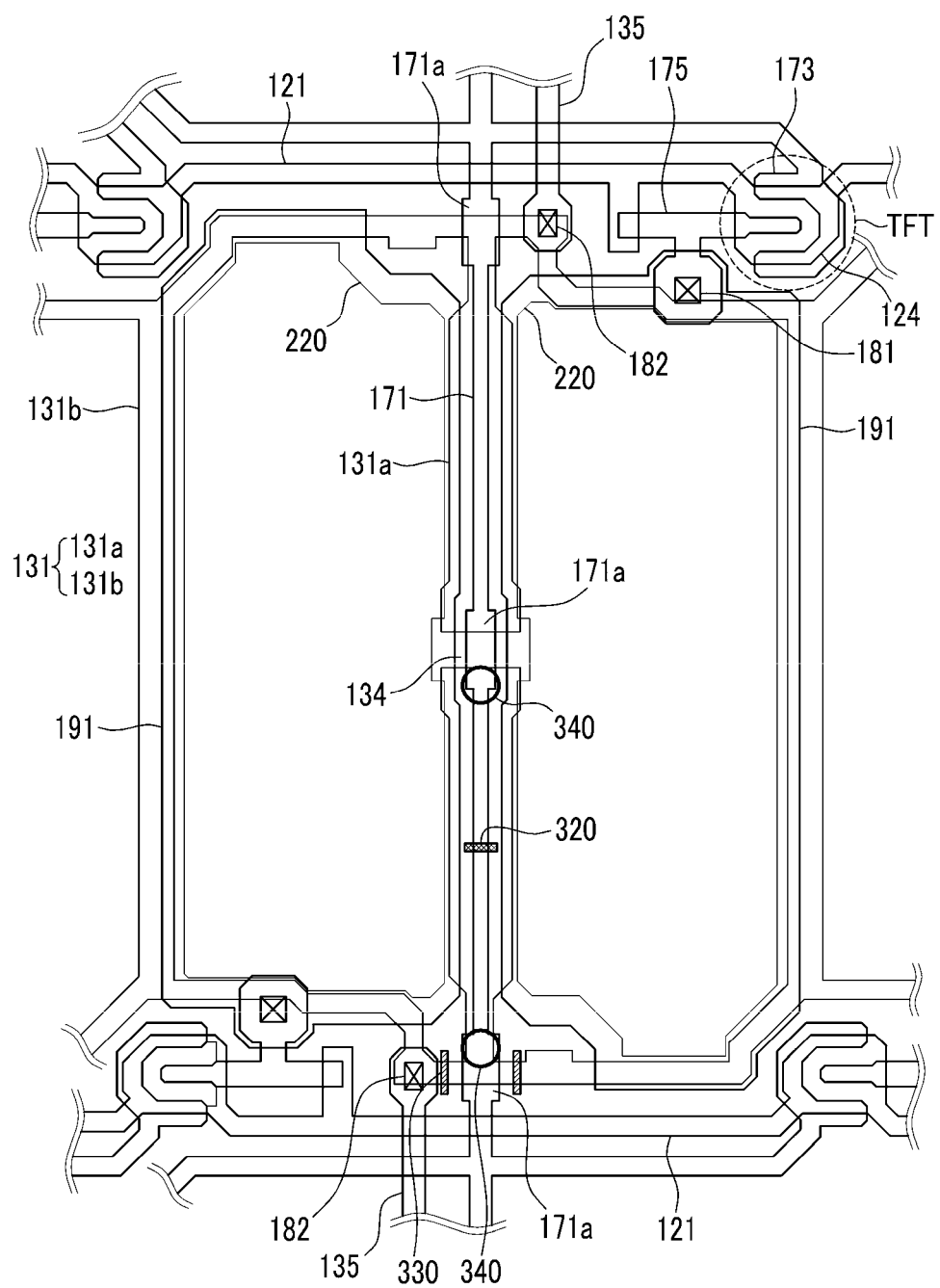
FIG. 11 is a top plan view showing a method of repairing a disconnection of a data line of a liquid crystal display according to exemplary embodiments of the present invention.

FIG. 11 is a top plan view showing a method of repairing a disconnection of a data line of the liquid crystal display described with reference to FIG. 5, FIG. 6, FIG. 7, and FIG. 8.

Referring to FIG. 11, a repair may be executed using the same method as described with reference to in FIG. 10; however, in FIG. 11, the defect of the data line 171 may be generated on a lower side relative to the disconnection portion 134 being disconnected.

A laser 340 may irradiate laser on the repairing portion 171a disposed on the upper and/or lower sides of the disconnection defect portion 320 to connect the data line 171 and the first portion 131a of the storage electrode 131. A laser 330 may irradiate laser on the second portion 131b connected to the first portion 131a used for the repair in the storage electrode 131 to be electrically separated for the disconnection.

When repairing the disconnection of the data line in the liquid crystal displays as described with reference to FIG. 10 and FIG. 11, the effect on neighboring pixels can be described in comparison to a liquid crystal display without a disconnection portion.

If a repair for a disconnection defect of a data line is executed in a liquid crystal display without a disconnection portion, an entire first portion of the storage electrode overlapping the data line may be used. In contrast, in the liquid crystal display described with reference to FIG. 10 and FIG. 11, the first portion 131a of the storage electrode 131 may include a disconnection portion 134 such that the upper half of the first portion 131a of the storage electrode 131 may be used for repairing when the upper portion of the data line 171 with reference to the disconnection portion 134 is disconnected. Alternatively, the lower half of the first portion 131a of the storage electrode 131 may be used for repairing when the lower portion of the data line 171 with reference to the disconnection portion 134 is disconnected.

The degree of distortion of the potential charged to the pixel electrode 191 may be described by a ratio of the first storage capacitance Cst1 and the second storage capacitance Cst2. The first storage capacitance Cst1 may be the storage capacitance between the storage electrode 131 used for the repair and the pixel electrode 919. The second storage capacitance Cst2 may be the storage capacitance between the storage electrode 131 that is not used for the repair and the pixel electrode 191. As the first storage capacitance Cst1 increases, the second storage capacitance Cst2 may decrease, and therefore, the potential of the corresponding pixel may be distorted. As the ratio (Cst1/Cst2) of the first storage capacitance Cst1 to the second storage capacitance Cst2 is decreased, the effect on the corresponding pixel may be minimized.

In a liquid crystal display without the disconnection portion, the first storage capacitance Cst1 may be about 661 pF to 905 pF, and the ratio (Cst1/Cst2) of the first storage capacitance Cst1 to the second storage capacitance Cst2 may be about 32% to 36%. In contrast, in the liquid crystal display described with reference to FIG. 1, FIG. 2, FIG. 3, FIG. 4, FIG. 5, FIG. 6, FIG. 7, FIG. 8, FIG. 10, and FIG. 11, the first storage capacitance Cst1 may be decreased to about 270 pF, and the ratio (Cst1/Cst2) of the first storage capacitance Cst1 to the second storage capacitance Cst2 may be decreased to 14% such that the effect on the corresponding pixel may be decreased to about ⅓.

Hereinafter, a method of repairing a disconnection of a data line 171 of the liquid crystal display described with reference to FIG. 9 will be described with reference to FIG. 12.

Figure 12:
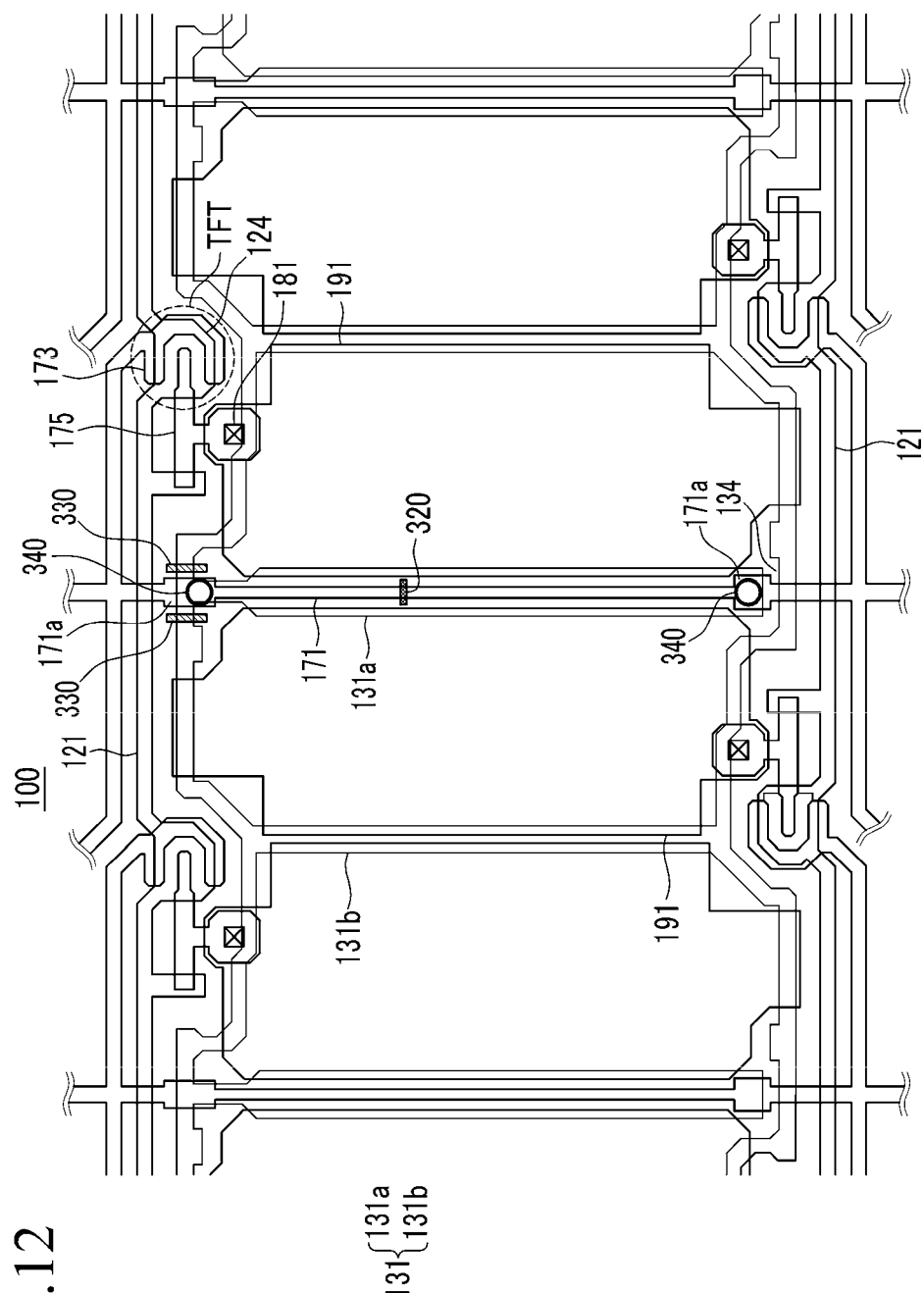
FIG. 12 is a top plan view showing a method of repairing a disconnection of a data line of a liquid crystal display according to exemplary embodiments of the present invention.

Referring to FIG. 12, a laser 340 may irradiate light on the repairing portion 171a disposed on the upper and/or lower sides of the disconnection defect portion 320 to connect the data line 171 and the first portion 131a of the storage electrode 131. A laser 330 may irradiate light for the second portion 131b connected to the first portion 131a used for the repair in the storage electrode 131 to be separated for the disconnection.

Hereinafter, a method of repairing a short of a pixel electrode 191 and a storage electrode 131 of the liquid crystal display described with reference to FIG. 1, FIG. 2, FIG. 3, and FIG. 4 will be described with reference to FIG. 13.

Figure 13:
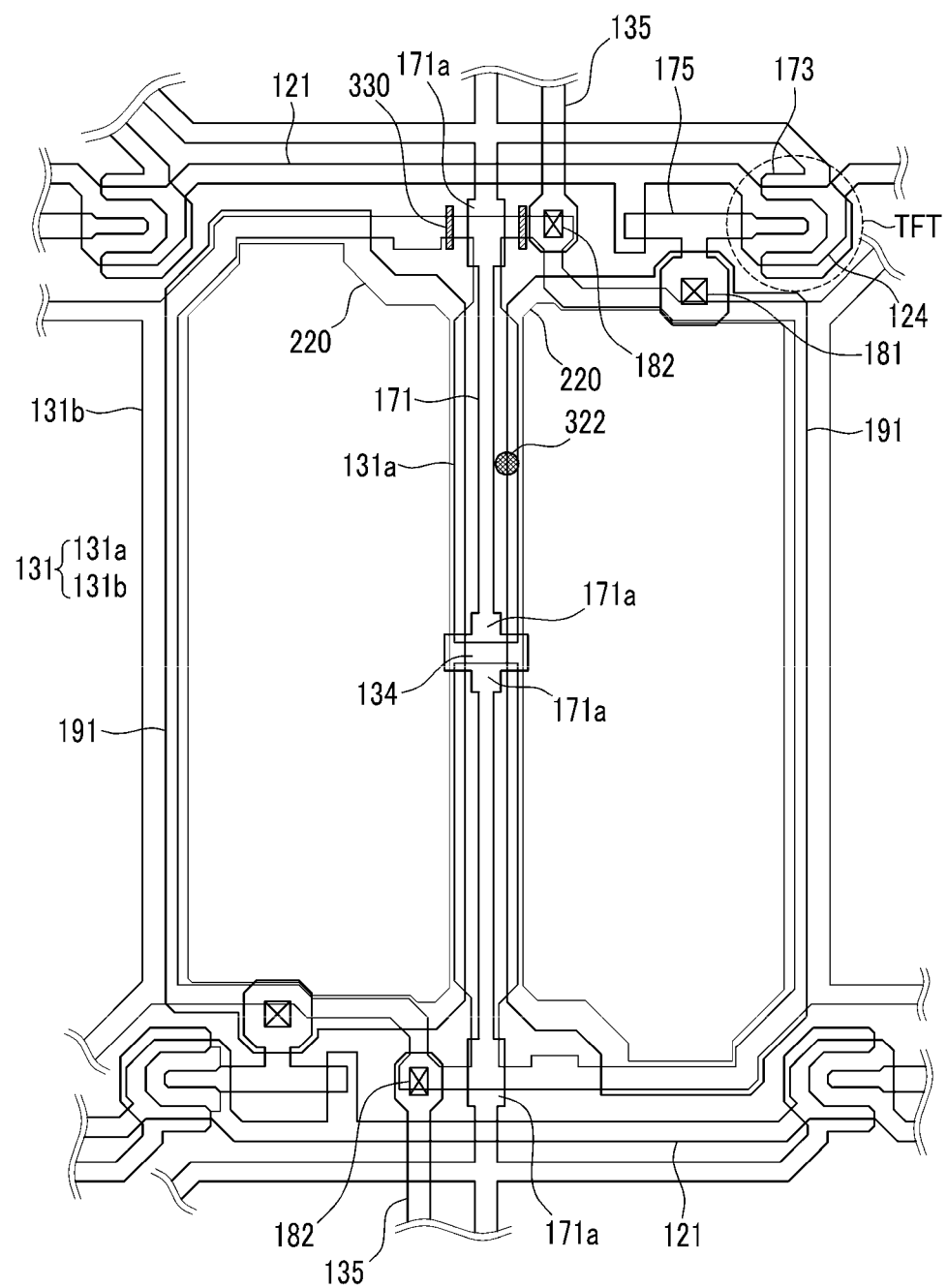
FIG. 13 is a top plan view showing a method of repairing a short of a pixel electrode and a storage electrode of a liquid crystal display according to exemplary embodiments of the present invention.

Referring to FIG. 13, when the first portion 131a of the storage electrode 131 that is positioned at the upper side relative to the disconnection portion 134 and the pixel electrode 191 that is positioned at the right side of the disconnection portion 134 are shorted, the pixel electrode 191 and the storage electrode 131 may be electrically connected to each other through a shorting defect portion 322. However, the voltage of the signal input to the pixel electrode 191 and the voltage applied to the storage electrode 131 may not be the same.

To electrically separate the second portion 131b connected to the first portion 131a of the storage electrode 131 including the shorting defect portion 322, the second portion 131b of the storage electrode 131 that is close to the shorting defect portion 322 and does not overlap the data line 171 and the pixel electrode 191 may be irradiated by the laser 330 to be disconnected.

Hereinafter, a method of repairing a short of a pixel electrode 191 and a storage electrode 131 of the liquid crystal display described with reference to FIG. 5, FIG. 6, FIG. 7, and FIG. 8 will be described with reference to FIG. 14.

Figure 14:
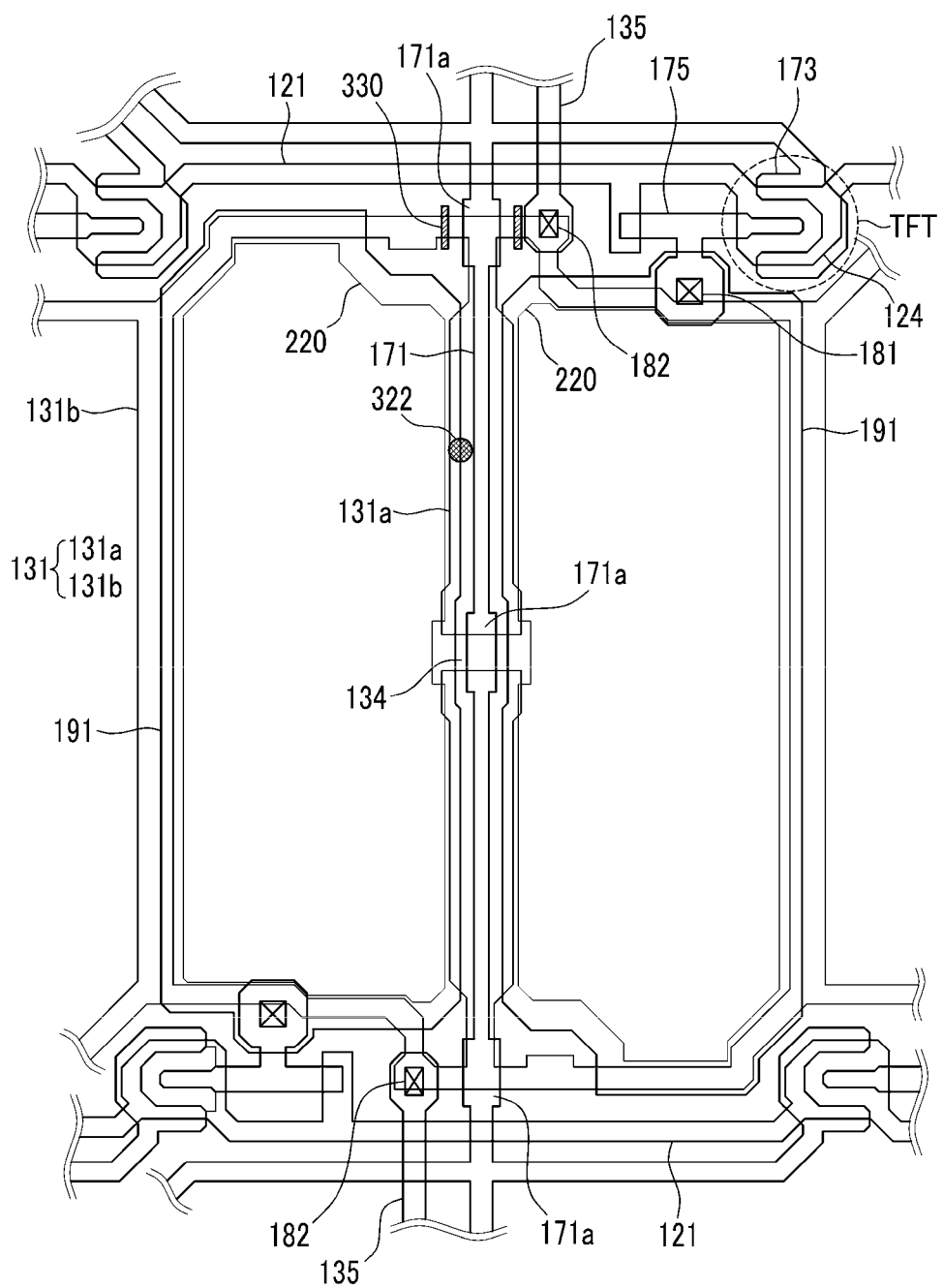
FIG. 14 is a top plan view showing a method of repairing a short of a pixel electrode and a storage electrode of a liquid crystal display according to exemplary embodiments of the present invention.

Referring to FIG. 14, the repair may be processed using the same method as described above with regard to FIG. 13; however, in the liquid crystal display described with reference to FIG. 5, FIG. 6, FIG. 7, and FIG. 8, the first portion 131a of the storage electrode 131 that is positioned at the upper side relative to the disconnection portion 134 and the pixel electrode 191 that is positioned at the left side of the disconnection portion 134 may be shorted.

To electrically separate the second portion 131b connected to the first portion 131a of the storage electrode 131 including the shorting defect portion 322, the second portion 131b of the storage electrode 131 that is close to the shorting defect portion 322 and does not overlap the data line 171 and the pixel electrode 191 may be irradiated by the laser 330 to be disconnected.

Like the above-described case of repairing the disconnection of the data line, when repairing the short of the pixel electrode and the storage electrode in the liquid crystal display described with reference to FIG. 13 and FIG. 14, the effect on the adjacent pixel may be reduced to about ⅓ compared with the liquid crystal display without the disconnection portion.

Hereinafter, a method of repairing a short of a pixel electrode 191 and a storage electrode 131 of the liquid crystal display described with reference to FIG. 9 and FIG. 12 will be described with reference to FIG. 15 and FIG. 16.

Figure 15:
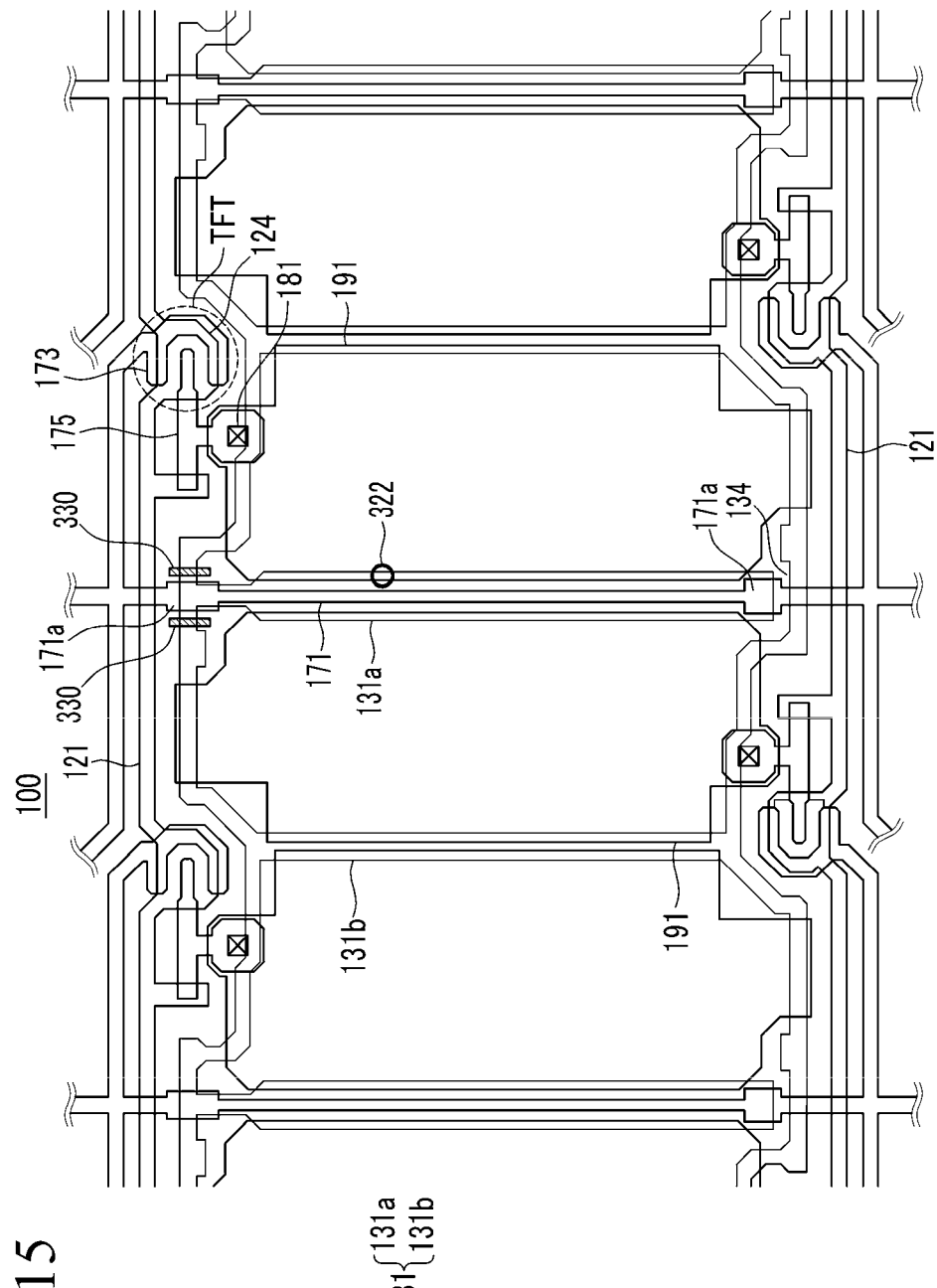
FIG. 15 is a top plan view showing a method of repairing a short of a first portion of a pixel electrode and a storage electrode of a liquid crystal display according to exemplary embodiments of the present invention.

Referring to FIG. 15, when the shorting defect is generated between the first portion 131a of the storage electrode 131 and the pixel electrode 191, the second portion 131b connected to the first portion 131a of the storage electrode 131 including the shorting defect portion 322 may be disconnected through the irradiation of a laser 330. The portion of the storage electrode 131 that is close to the shorting defect portion 322 and not overlap the data line 171, and the pixel electrode 191 may be irradiated by the laser 330. The lower end of the first portion 131a of the storage electrode 131 may be separated from the second portion 131b such that the laser 330 may be irradiated to only the second portion 131b that is positioned at both sides of the upper end of the first portion 131a.

Figure 16:
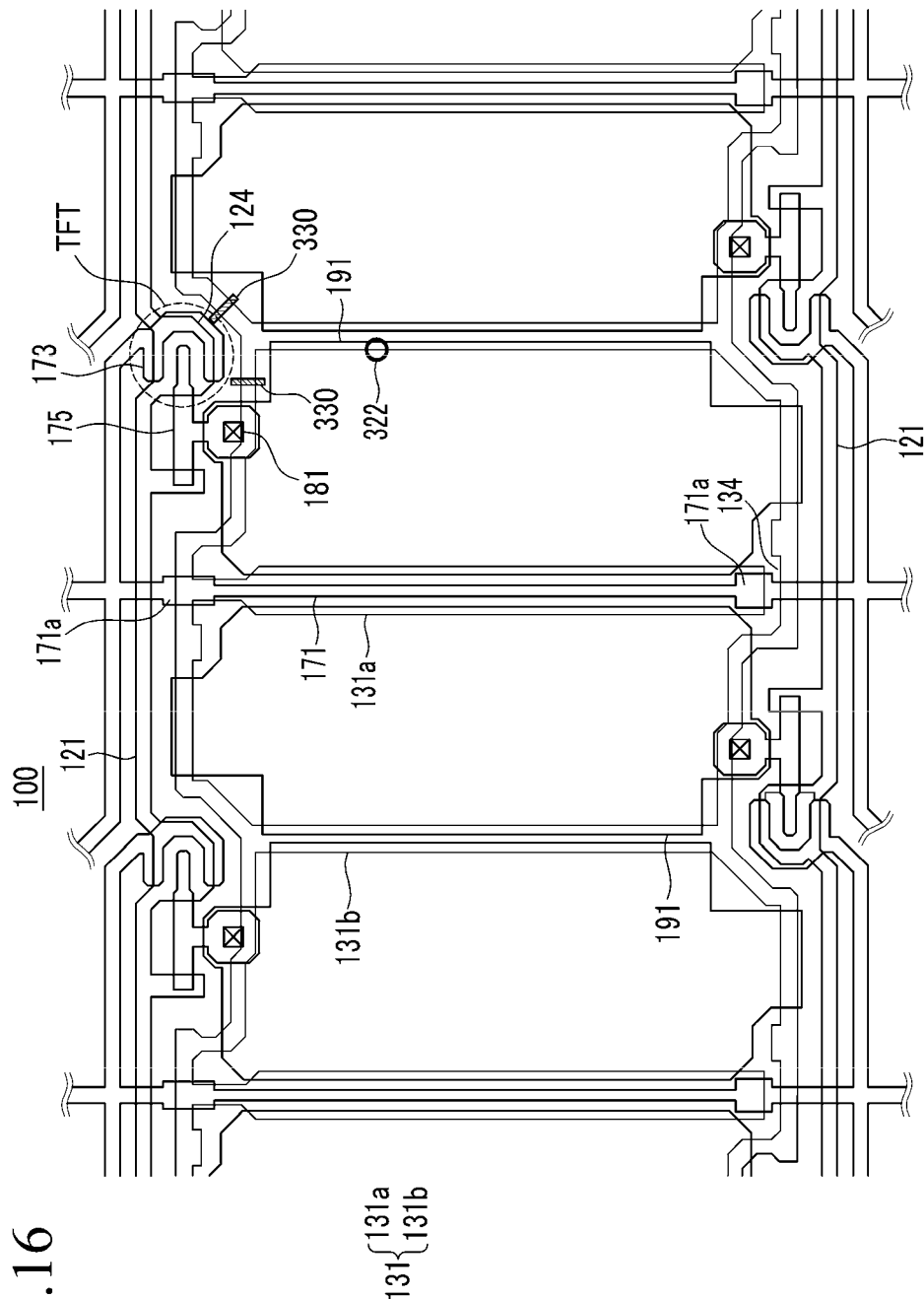
FIG. 16 is a top plan view showing a method of repairing a short of a second portion of a pixel electrode and a storage electrode of a liquid crystal display according to exemplary embodiments of the present invention.

Referring to FIG. 16, when the shorting defect is generated between the second portion 131b of the storage electrode 131 and the pixel electrode 191, the laser 330 may be irradiated to separate the portion where the shorting defect portion 322 is positioned from the storage electrode 131 to be disconnected. The laser 330 may be irradiated on the portion where the storage electrode 131 does not overlap the data line 171 and the pixel electrode 191 while being close to the shorting defect portion 322. The second portion 131b of the storage electrode 131 may be connected to the portion parallel to the gate line 121 and the portion parallel to the data line 171 such that the laser 330 may be irradiated on the upper and lower sides of the second portion 131b of the storage electrode 131 with reference to the shorting defect portion 322.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A thin film transistor array panel, comprising:
    a substrate;
    a gate line disposed on the substrate along a first direction;
    a data line disposed on the substrate along a second direction different from the first direction;
    a thin film transistor connected to the gate line and the data line;
    a pixel electrode connected to the thin film transistor; and
    a storage electrode disposed on the substrate, the storage electrode comprising a first portion disposed along the first direction and a second portion disposed along the second direction,
    wherein the data line comprises a first portion and a second portion, the first portion of the data line having a first width, and the second portion of the data line having a second width wider than the first width,
    wherein the first portion and the second portion of the data line overlap the first portion and the second portion of the storage electrode, respectively, and
    wherein the pixel electrode overlaps the second portion of the storage electrode, and a width of a portion of the second portion of the storage electrode overlapped by the pixel electrode is less than 3.5 μm.

2. The thin film transistor array panel of claim 1, wherein the storage electrode further comprises a third portion disposed along the second direction, the third portion not overlapping the data line.

3. A thin film transistor array panel, comprising:
    a substrate;
    a gate line disposed on the substrate along a first direction;
    a data line disposed on the substrate;
    a thin film transistor connected to the gate line and the data line;
    a pixel electrode connected to the thin film transistor; and
    a storage electrode disposed on the substrate, the storage electrode comprising a first portion disposed along the first direction,
    wherein the data line comprises a first portion and a second portion, the first portion of the data line having a first width, and the second portion of the data line having a second width wider than the first width,
    wherein the second portion of the data line overlaps the first portion of the storage electrode, and
    wherein the storage electrode further comprises an opening, and the data line overlaps the opening.

4. The thin film transistor array panel of claim 3, wherein portions of the storage electrode disposed on opposite sides of the opening are electrically connected to each other.

5. The thin film transistor array panel of claim 4, wherein at least a portion of the second portion of the data line overlaps at least a portion of the opening.

6. The thin film transistor array panel of claim 5, wherein the storage electrode completely surrounds the opening.

7. A liquid crystal display, comprising:
    a substrate;
    a gate line disposed on the substrate along a first direction;
    a data line disposed on the substrate;

a thin film transistor connected to the gate line and the data line;

a pixel electrode connected to the thin film transistor; and a storage electrode disposed on the substrate, the storage electrode comprising a first portion disposed along the first direction, wherein the data line comprises a first portion and a second portion, the first portion of the data line having a first width and the second portion of the data line having a second width wider than the first width, and wherein the second portion of the data line overlaps the first portion of the storage electrode, and wherein only the first portion of the data line overlaps the gate line.

8. The liquid crystal display of claim 7, wherein the data line is disposed along a second direction different from the first direction.

9. The liquid crystal display of claim 8, wherein:

the storage electrode further comprises a second portion disposed along the second direction; and the first portion of the data line overlaps the second portion of the storage electrode.

10. The liquid crystal display of claim 9, wherein the storage electrode further comprises a third portion disposed along the second direction, the third portion not overlapping the data line.

11. The liquid crystal display of claim 7, wherein portions of the storage electrode disposed on opposite sides of an opening formed in the storage electrode are electrically connected to each other.

12. The liquid crystal display of claim 11, wherein at least a portion of the second portion of the data line overlaps at least a portion of the opening.

13. The liquid crystal display of claim 12, wherein the storage electrode completely surrounds the opening.

14. The thin film transistor array panel of claim 3, wherein the data line is disposed along a second direction different from the first direction.

15. The thin film transistor array panel of claim 14, wherein:

the storage electrode further comprises a second portion disposed along the second direction; and the first portion of the data line overlaps the second portion of the storage electrode.

16. The thin film transistor array panel of claim 15, wherein the storage electrode further comprises a third portion disposed along the second direction, the third portion not overlapping the data line.

* * * * *